United States Patent
Veerasamy et al.

(10) Patent No.: US 9,293,653 B2
(45) Date of Patent: Mar. 22, 2016

(54) LIGHT SOURCE WITH LIGHT SCATTERING FEATURES, DEVICE INCLUDING LIGHT SOURCE WITH LIGHT SCATTERING FEATURES, AND/OR METHODS OF MAKING THE SAME

(75) Inventors: Vijayen S. Veerasamy, Ann Arbor, MI (US); Jemssy Alvarez, Gregory, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 946 days.

(21) Appl. No.: 12/923,834

(22) Filed: Oct. 8, 2010

(65) Prior Publication Data

US 2012/0086022 A1    Apr. 12, 2012

(51) Int. Cl.
- H01L 21/00    (2006.01)
- H01L 33/22    (2010.01)
- H01L 23/00    (2006.01)

(52) U.S. Cl.
CPC .............. *H01L 33/22* (2013.01); *H01L 24/14* (2013.01); *H01L 24/17* (2013.01); *H01L 2924/12041* (2013.01); *H01L 2924/12043* (2013.01)

(58) Field of Classification Search
USPC ..................... 438/32; 257/E33.069
See application file for complete search history.

(56) References Cited

U.S. PATENT DOCUMENTS

| | | | |
|---|---|---|---|
| 4,918,487 A | 4/1990 | Coulter, Jr. | |
| 5,631,190 A | 5/1997 | Negley | |
| 5,657,607 A | 8/1997 | Collins et al. | |
| 5,664,395 A | 9/1997 | Collins et al. | |
| 5,902,652 A | 5/1999 | Collins et al. | |
| 5,912,477 A | 6/1999 | Negley | |
| 6,657,236 B1 | 12/2003 | Thibeault et al. | |
| 7,755,096 B2 | 7/2010 | Weisbuch et al. | |
| 2006/0202226 A1 | 9/2006 | Weisbuch et al. | |
| 2007/0037307 A1* | 2/2007 | Donofrio | 438/42 |
| 2008/0008964 A1 | 1/2008 | Chan et al. | |
| 2008/0087909 A1 | 4/2008 | Weisbuch et al. | |

(Continued)

FOREIGN PATENT DOCUMENTS

| | | |
|---|---|---|
| CN | 101075652 | 11/2007 |
| CN | 101840982 | 9/2010 |

(Continued)

OTHER PUBLICATIONS

U.S. Appl. No. 12/923,833, filed Oct. 8, 2010; Veerasamy et al.

(Continued)

*Primary Examiner* — Daniel Whalen
(74) *Attorney, Agent, or Firm* — Nixon & Vanderhye P.C.

(57) ABSTRACT

Certain example embodiments of this invention relate to techniques for improving the performance of Lambertian and non-Lambertian light sources. In certain example embodiments, this is accomplished by (1) providing an organic-inorganic hybrid material on LEDs (which in certain example embodiments may be a high index of refraction material), (2) enhancing the light scattering ability of the LEDs (e.g., by fractal embossing, patterning, or the like, and/or by providing randomly dispersed elements thereon), and/or (3) improving performance through advanced cooling techniques. In certain example instances, performance enhancements may include, for example, better color production (e.g., in terms of a high CRI), better light production (e.g., in terms of lumens and non-Lambertian lighting), higher internal and/or external efficiency, etc.

16 Claims, 9 Drawing Sheets

(56) References Cited

U.S. PATENT DOCUMENTS

| | | |
|---|---|---|
| 2009/0151853 A1 | 6/2009 | Cooper |
| 2009/0151854 A1 | 6/2009 | Cooper |
| 2009/0151855 A1 | 6/2009 | Wang et al. |
| 2009/0152573 A1 | 6/2009 | Loh et al. |
| 2009/0155499 A1 | 6/2009 | Cooper |
| 2009/0155500 A1 | 6/2009 | Cooper et al. |
| 2009/0176324 A1 | 7/2009 | Tsai |
| 2010/0181584 A1 | 7/2010 | Gao et al. |
| 2010/0207147 A1* | 8/2010 | Kim .................... 257/98 |
| 2010/0219427 A1* | 9/2010 | Fukuda ........ H01L 51/5268 257/89 |

FOREIGN PATENT DOCUMENTS

| | | |
|---|---|---|
| DE | 10 2004 039 883 | 6/2006 |
| EP | 0 544 512 | 6/1993 |
| EP | 0 983 974 | 3/2000 |
| JP | 2009-500872 A | 1/2009 |
| WO | WO 02/052191 | 7/2002 |
| WO | WO 2010/092362 | 8/2010 |

OTHER PUBLICATIONS

U.S. Appl. No. 12/923,842, filed Oct. 8, 2010; Veerasamy et al.
U.S. Appl. No. 12/923,835, filed Oct. 8, 2010; Veerasamy et al.
U.S. Appl. No. 12/923,146, filed Sep. 3, 2010; Broadway et al.
U.S. Appl. No. 12/659,352, filed Mar. 4, 2010; Veerasamy.
U.S. Appl. No. 12/654,269, filed Dec. 15, 2009; Veerasamy.
U.S. Appl. No. 12/801,257, filed May 28, 2010; Veerasamy.
U.S. Appl. No. 12/453,220, filed May 1, 2009; Wang.
U.S. Appl. No. 12/453,221, filed May 1, 2009; Wang.
International Search Report dated May 18, 2012.
CN Office Action for Application No. 201180058471.2.

* cited by examiner

LIGHT SOURCE WITH LIGHT SCATTERING FEATURES, DEVICE INCLUDING LIGHT SOURCE WITH LIGHT SCATTERING FEATURES, AND/OR METHODS OF MAKING THE SAME

FIELD OF THE INVENTION

Certain example embodiments of this invention relate to light sources, devices including light sources, and methods of making the same. More particularly, certain example embodiments of this invention relate to techniques for improving the performance (e.g., efficiency, color and/or light production, etc.) of light sources that may be Lambertian or non-Lambertian. In certain example embodiments, this is accomplished by (1) providing an organic-inorganic hybrid material on LEDs (which in certain example embodiments may be a high index of refraction material), (2) enhancing the light scattering ability of the LEDs (e.g., by fractal embossing, patterning, or the like, and/or by providing randomly dispersed elements thereon), and/or (3) improving performance through advanced cooling techniques.

BACKGROUND AND SUMMARY OF EXAMPLE EMBODIMENTS OF THE INVENTION

A large proportion (some estimates are as high as 25%) of the electricity generated in the United States each year goes to lighting. Accordingly, there is an ongoing need to provide lighting that is more energy-efficient. It is well-known that incandescent light bulbs are very energy-inefficient light sources. About 90% of the electricity they consume is released as heat rather than light. Fluorescent light bulbs are more efficient than incandescent light bulbs (e.g., by a factor of about 10) but are still less efficient as compared to solid state light emitters, such as light emitting diodes.

In addition, as compared to the normal lifetimes of solid state light emitters, e.g., light emitting diodes, incandescent light bulbs have relatively short lifetimes, typically about 750-1,000 hours. In comparison, light emitting diodes, for example, have typical lifetimes between 50,000 and 70,000 hours. Fluorescent bulbs have yet longer lifetimes (e.g., 10,000-20,000 hours) than incandescent lights, but provide less favorable color reproduction.

Color reproduction is typically measured using the Color Rendering Index (CRI Ra), which is a relative measure of the shift in surface color of an object when lit by a particular lamp. CRI Ra is a modified average of the measurements of how the color rendition of an illumination system compares to that of a reference radiator when illuminating eight reference colors. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI Ra. For example, mercury vapor or sodium lamps have Ra as low as about 40 or even lower. Another challenge facing the development of new lighting systems is how to achieve a high CRI.

Another issue faced by conventional light fixtures is the need to periodically replace the lighting devices (e.g., light bulbs, etc.). Such issues are particularly problematic where access is difficult (e.g., vaulted ceilings, bridges, high buildings, traffic tunnels, etc.) and/or where change-out costs are extremely high. The typical lifetime of conventional fixtures is about 20 years, corresponding to a light-producing device usage of at least about 44,000 hours (e.g., based on usage of 6 hours per day for 20 years). Light-producing device lifetime is typically much shorter, thereby creating the need for periodic change-outs. Thus, a further challenge lies in achieving a long lifetime so as to reduce the amount of downtime.

Designs have been provided in which existing LED component packages and other electronics are assembled into a fixture. In such designs, a packaged LED is mounted to a circuit board mounted to a heat sink, and the heat sink is mounted to the fixture housing along with required drive electronics. In many cases, additional optics (secondary to the package parts) are also needed to produce uniform illumination. Short of the optics, LEDS behave as point sources that fan out the light. LEDS especially at the die level are Lambertian in nature.

The expression "light emitting diode" is sometimes used to refer to the basic semiconductor diode structure (e.g., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477 (each incorporated herein by reference in its entirety), various wire connections, and a package that encapsulates the light emitting diode.

In substituting light emitting diodes for other light sources, e.g., incandescent light bulbs, packaged LEDs have been used with conventional light fixtures, for example, fixtures that include a hollow lens and a base plate attached to the lens, the base plate having a conventional socket housing with one or more contacts that is/are electrically coupled to a power source. For example, LED light bulbs that comprise an electrical circuit board, a plurality of packaged LEDs mounted to the circuit board, and a connection post attached to the circuit board and adapted to be connected to the socket housing of the light fixture, whereby the plurality of LEDs can be illuminated by the power source, have been constructed.

FIG. 1 is a molded, flexible silicone rubber untinted, diffused light guide array 102 usable in connection with LED light sources. The FIG. 1 example may be used, for example, in connection with backlighting keypads and indicator windows, e.g., in front panel assemblies. Differently sized and/or shaped light pipe elements 104, 106, and 108 may be provided in the light guide array 102. LED lamps may fit against the bases of the solid light pipe elements 104, 106, and 108, or fit inside hollow light pipe elements. The light pipe array 102 may be placed over an LED lamp PC board assembly to form a backlighting unit.

FIG. 2 is a simplified view of a LED lighted panel assembly 200. This internally lighted panel uses HLMP-650X untinted, non-diffused, SMT subminiature LED lamps 202 surface mounted on a double-sided PC board 204. Maximum metalization is used on both sides to achieve a low thermal resistance to ambient, and metallization vias 206 are shown in FIG. 2. The LED lamps 202 are distributed throughout the panel (which includes a glass substrate 208) to achieve a desired lighting effect. Light rays from the LED lamps 202 blend together within the panel to produce a somewhat more even illumination through the illuminated areas on the face of the panel 200. These illuminated areas are diffused and coated with a thin layer of translucent white paint. In daylight, the LED lamps 202 are off, and the illumination areas 210 appear white by reflecting ambient light. At night, these areas are internally illuminated by the LED lamps 202 and appear the same color as the LED light. The exterior surfaces of the panel 200 are painted with a white reflecting paint, leaving open the areas on the face of the panel to be internally illuminated. An overcoat of black, scratch resistant paint is added to form the exterior finish 212. The overall thickness of the panel is 5.84 mm.

Although the development of light emitting diodes has in many ways revolutionized the lighting industry, some of the characteristics of light emitting diodes have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, e.g., for providing lighting, such an emission spectrum provides a very low CRI Ra.

Thus, it will be appreciated that there is a need in the art for an improved light source/fixture that overcomes one or more of these and/or other difficulties, and/or method of making the same.

In certain example embodiments, a method of making a coated article including a substrate supporting a coating is provided. A titanium-based precursor is provided. A chelate is provided. The titanium-based precursor is reacted with the chelate to form a chelated titanium-inclusive substance. An organic resin material is provided. The chelated titanium-inclusive substance is cross-linked with the organic resin material to form an organic-inorganic hybrid solution. The organic-inorganic hybrid solution is disposed on the substrate in forming the coating.

In certain example embodiments, a method of making a coated article including a substrate supporting a coating is provided. An organic-inorganic hybrid solution is provided, with the organic-inorganic hybrid solution having been made by: reacting a titanium- and/or zirconium-based precursor with a chelate to form a chelated substance, and cross-linking the chelated substance with an organic material to form the organic-inorganic hybrid solution. Either (a) the organic-inorganic hybrid solution is wet applied on the substrate, or (b) the organic-inorganic hybrid solution is introduced into a carrier medium and then the carrier medium is extruded onto the substrate. The organic-inorganic hybrid solution is cured once disposed on the substrate.

In certain example embodiments, a method of making an electronic device is provided. A substrate is provided. At least one light emitting diode (LED) is disposed on the substrate. An organic-inorganic hybrid solution is provided, with the organic-inorganic hybrid solution having been made by: reacting a titanium- and/or zirconium-based precursor with a chelate to form a chelated substance, and cross-linking the chelated substance with an organic material to form the organic-inorganic hybrid solution. Either (a) the organic-inorganic hybrid solution is wet applied on the substrate over the at least one LED, or (b) the organic-inorganic hybrid solution is introduced into a carrier medium and then the carrier medium is extruded onto the substrate over the at least one LED. The organic-inorganic hybrid solution is cured once disposed on the substrate.

In certain example embodiments, a device is provided. A first substrate is provided. A mirror is supported by the first substrate. A printed circuit board supports a plurality of light emitting diodes (LEDs)/ A second substrate is provided. A laminate is supported by a first major surface of the second substrate that faces the printed circuit board supporting the plurality of LEDs. The laminate is formed from a first organic-inorganic hybrid solution, with the laminate having an index of refraction of at least about 1.8.

In certain example embodiments, a device is provided. A first glass substrate is provided. A thin-film mirror coating is supported by the first substrate. A flexible printed circuit (FPC) supports a plurality of light emitting diodes (LEDs) flip-chip mounted thereto. A second glass substrate is provided. A laminate is supported by a first major surface of the second substrate that faces the printed circuit board supporting the plurality of LEDs, with the laminate laminating together the first and second substrates.

In certain example embodiments, a device is provided. A first glass substrate is provided. A thin-film mirror coating is supported by the first substrate. A flexible printed circuit (FPC) supports a plurality of light emitting diodes (LEDs) flip-chip mounted thereto. A polymer-based insulator layer is interposed between the mirror and the FPC, with the insulator layer being formed from a first organic-inorganic hybrid solution. A second glass substrate is provided. A laminate is supported by a first major surface of the second substrate that faces the printed circuit board supporting the plurality of LEDs, with the laminate laminating together the first and second substrates.

In certain example embodiments, a method of making an LED device is provided. A substrate is provided. A plurality of LEDs is formed on the substrate. A random pattern is created on the LEDs and/or in one or more layers of the LEDs, with the random pattern having a light scattering effect on light produced by the LEDs. In certain example embodiments, an LED device is provided.

According to certain example embodiments, the random pattern may be created by: generating a fractal pattern, with the fractal pattern being a random fractal pattern or having randomness introduced thereto; and transferring the generated fractal pattern onto one or more layers of the LEDs.

According to certain example embodiments, the random pattern may be created by: providing an aqueous solution of nano- or micron-scale elements; and disposing the solution to an area, directly or indirectly, on the LEDs to randomly disperse the elements on the LEDs.

In certain example embodiments, a device is provided. First and second glass substrates are provided, with the first and second substrates being substantially parallel and spaced apart so as to define a cavity therebetween. A plurality of pillars is disposed between the first and second substrates. An edge seal is provided around the periphery of the first and/or second substrate(s). At least one conductive bus bar is disposed on an inner surface of the second substrate facing the first substrate. At least one n-leg and at least one p-leg is in contact with the at least one bus bar. At least one conductor connects the at least one n-leg and the at least one p-leg. At least one LED supported by the at least one conductor. In certain example embodiments, a method of making the same is provided.

In certain example embodiments, a device is provided. First and second glass substrates are provided, with the first and second substrates being substantially parallel and spaced apart so as to define a cavity therebetween. A plurality of pillars is disposed between the first and second substrates. An edge seal is provided around the periphery of the first and/or second substrate(s). At least one conductive bus bar is disposed on an inner surface of the second substrate facing the first substrate. A plurality of thermoelectric (TE) modules is in contact with the at least one bus bar, with each said TE module including an n-leg and p-leg connected to one another via a conductor. A plurality of ILEDs is disposed on conductors of the plurality of TE modules. In certain example embodiments, a method of making the same is provided.

The features, aspects, advantages, and example embodiments described herein may be combined in any suitable combination or sub-combination to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Figure 1:
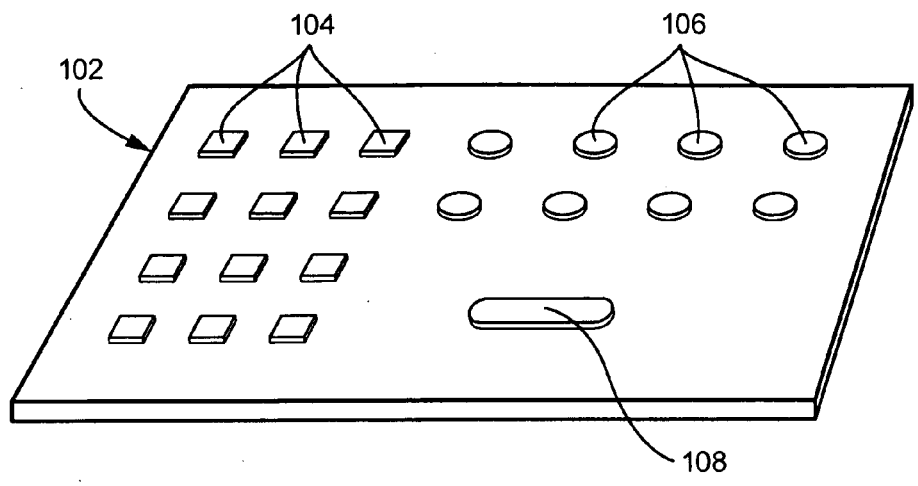
FIG. 1 is a molded, flexible silicone rubber untinted, diffused light guide array usable in connection with LED light sources.
Figure 2:
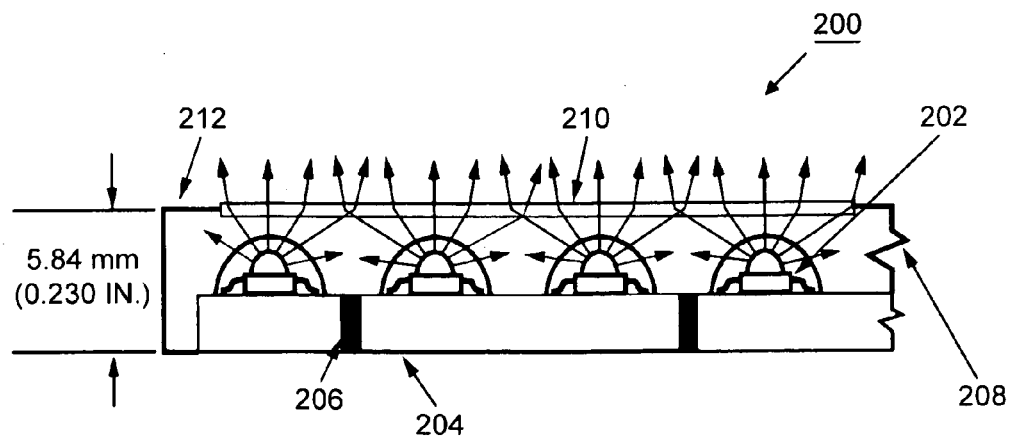
FIG. 2 is a simplified view of a LED lighted panel assembly.

Certain example embodiments relate to substantially flat solid state lighting based on two dimensional arrays of LEDS systems embedded or laminated in glass for flat and/or curve manifolds, and/or methods of making the same. In certain example embodiments, light out-coupling techniques are used to make these light systems more efficient. Such devices may in certain example instances be run at low current densities thresholds, which consequently reduces heat issues. Currently inorganic LEDs (LEDS or ILEDS) are packaged individually in plastic (sometimes epoxy) packaging. LEDS are thus point sources whereby the intensity of the light varies inversely with the square of distance X cos $\Omega$. Recently, there has been a trend to tile these LEDS in linear arrays for various systems where the light can be coupled to the edge of the glass such as in backlights for LCD TV panels. In such devices, specific diffusers are used to couple the light out.

As is known, a Lambertian source is an optical source that obeys Lambert's cosine law in that the radiance of the optical source is directly proportional to the cosine of the angle, with respect to the direction of maximum radiance, from which the source is viewed. LEDs approximate Lambertian sources because they tend to have a large beam divergence and a radiation pattern that approximates a sphere. Certain example embodiments may include Lambertian and/or non-Lambertian light sources. In certain example embodiments, a Lambertian light source may be achieved by providing a non-Lambertian light source with an out-coupling photometric diffuser (e.g., of or including acetal, silicon dioxide, etc.) proximate to the non-Lambertian light source to achieve a Lambertian or Lambertian-like effect. Although reference has been made to Lambertian (and non-Lambertian) light sources, it will be appreciated that a light source may be considered Lambertian (or non-Lambertian) even though the light source is substantially Lambertian (or substantially non-Lambertian).

High efficiency light emitting diodes (LEDs) are desired for many applications such as, for example, displays, printers, short-haul communications, optoelectronic computer interconnects, etc. Unfortunately, however, there is a gap between the internal efficiency of LEDs and their external efficiency. The internal quantum yield of good quality double heterostructures can exceed 99%. On the other hand, ordinary packaged LEDs are usually only a few percent efficient. One reason for this shortfall is the difficulty of light escaping from high refractive index semiconductors, e.g., because of the narrow escape cone for light. The escape cone for internal light in a semiconductor of refractive index of n=3.5 is only ~16 degrees, as imposed by Snell's Law.

This narrow escape cone for spontaneous emission covers a solid angle of $\Omega \approx \frac{1}{4} n_s^2 \times 4\pi$ Steradians. A mere 2% of the internally generated light can escape into free space, with the rest suffering total internal reflection and risking re-absorption. A number of schemes have partially overcome this problem, based on the idea of coupling the light out of diode semiconductor by using a matching index hemispherical dome. However, short of that perfect match, the escape solid angle is $\Omega \approx n_c^2 / 4 n_s^2 \times 4\pi$ Steradians.

Most of the packaging used is plastic, which has a refractive index that is much less than that of the semiconductor (nc<<ns). Epoxy is often used as the encapsulant, and its refractive index is still much less than GaAs and GaN, which are the materials often used for LEDs.

This formula is actually a general upper limit since it can be derived by statistical mechanical phase-space arguments without reference to a specific lens geometry. Therefore, it applies to inverse Winston concentrators and other types of optical schemes. For a matching refractive index, the "lens" structure may be a thick, transparent, semiconductor layer, which may sometimes add to the cost. The present state-of-the-art is ~30% external efficiency in AlGaAs-based LEDs that employ a thick transparent semiconductor superstrate, and total substrate etching in a particularly low-loss optical design. One way to increase the escape probability is to give the photons multiple opportunities to find the escape cone.

Certain example embodiments involve bare LED arrays that are de-bonded from a substrate or provided in a flip-chip format. For instance, certain example embodiments may involve debonding thin-film LEDs from their substrates (e.g., by epitaxial lift-off) and tiling them in linear and two dimensional arrays onto a glass substrate that has already been coated with conductive bus bars. Certain example embodiments may involve directly mounting LEDs onto a flexible PCB. Such a PCB may be bonded to a glass substrate that has a conductive coating to aid in dissipating heat. The LED array may be overcoated with a transparent, high refractive index layer. Such example arrangements advantageously make it much easier for light to escape from the LED structure, thereby reducing absorption. In certain example embodiments, by nano-texturing the thin-film surface using various techniques, the light ray dynamics becomes chaotic, and the optical phase-space distribution becomes "ergodic," allowing even more of the light to find the escape cone. Simulations of such example techniques have demonstrated at least 30% external efficiency in GaAs LEDs employing these example principles.

Applying a transparent high refractive index coating layer between the active circuitry and air or low refractive index packaging layer onto these devices may further improve their performance. For example, the more gradual transition from the high refractive index of the active circuitry to air or low refractive index package layer may allow light to be coupled into or out of the device more effectively, thereby increasing its efficiency and/or image quality. With higher efficiency, devices can be made more powerful while consuming less energy. Because some of these optical devices are made from semiconductor materials that have refractive indices as high as about 2.5-3.5, the desired refractive index of such transparent coating layers is at least 1.8 over the entire visible region and preferably greater than 1.9.

A polymer would be a good choice for a coating material if its refractive index is high enough, at least because of its ease of processing and potential low cost. Unfortunately such a polymer does not exist. The polymer with the world's highest refractive index at present is believed to have a refractive index of about 1.76 and was developed by Sadayori and Hotta of Nitto Denko.

Inorganic materials that have high refractive indices and high transparency may be used in certain example embodiments, as may transition metal oxides such as titanium dioxide or zirconium dioxide (e.g., superlattice nanocrystalline zirconia).

Coatings prepared from solutions such as, for example, metal oxide containing materials such as sol-gel coatings and nano-particle composites sometimes are brittle and subject to cracking, and their applications may be limited by their relatively complicated manufacturing process, storage stability, and reliability. Such coatings generally are not well suited for high processing temperatures (e.g., at or above about 400 degrees C.), which is a drawback for most semiconducting devices.

Sputtering is another technique currently being used to generate high index thin films from these and/or other metal oxides. Unfortunately, however, optical device manufacturers may seek other more cost-effective methods, as sputtering is generally known to be a relatively higher cost and lower throughput approach.

Certain example embodiments involve hybrid coating systems based on polymeric titanium dioxide and/or polymeric zirconia based systems. The organic-inorganic hybrid polymer solution is prepared by first reacting the titanium alkoxide with a chelating agent to convert the highly reactive tetra-coordinate titanium species to a less reactive hexa-coordinate species. Other desired polymer components may then be added to the stabilized titanium containing solution and thoroughly mixed. As a result of the stabilization, the hybrid polymer solution may be stable at room temperature up to 6 months with negligible change in color and viscosity. The hybrid polymer solution may be spin-coated or vertical slot coated onto substrates to a desired thickness.

A titanium dioxide rich film was generated by thermally decomposing the hybrid coatings at an elevated temperature of less than about 250 degrees C. The resulting dried films may be made as thin as 0.2 um and up to about 4 um or more. Such films may have good transparency and have refractive indices as high or higher than about 1.90 in the entire visible region when the cure temperature was 300 degrees C. or higher. A crack-free film over 300 nm in thickness was obtained with a single coating application. Multiple-coating is applicable to obtain a thicker film, and no apparent interface was seen from SEM cross-section images between two consecutive coatings. The hybrid high refractive index films are mechanically robust, stable upon exposure to both heat and UV radiation, and may be applicable for a wide variety of optical applications. The material is compatible with semiconducting material.

In certain example embodiments, the organic-inorganic hybrid polymer may be introduced into a laminable medium such as ethylene-vinyl acetate (EVA), silicones, aramids, etc. This would then allow the use of vacuum bonding or de-airing, sometimes without the use of autoclave.

The organic polymers chosen contained multiple hydroxy functionalities. They were so chosen to allow primary or secondary chemical bonding between the polymer and the titanium dioxide phase to promote phase compatibility and a high degree of dispersion. The chelated poly(dibutyl titanate) polymer and the organic polymer are compatible in all or substantially all proportions, both in solution and in the cured film, as evidenced by their high transparency and the refractive index dispersion curves. Typically, an index as high as or higher than 1.9 is obtained at 550 nm for a thickness of 0.4 um. When deposited on any inorganic light emitting diode, even a film as thin as 0.4 um dramatically improves the light out-coupling from the high refractive index material significantly typically in the incremental range of 70%.

Figure 3:
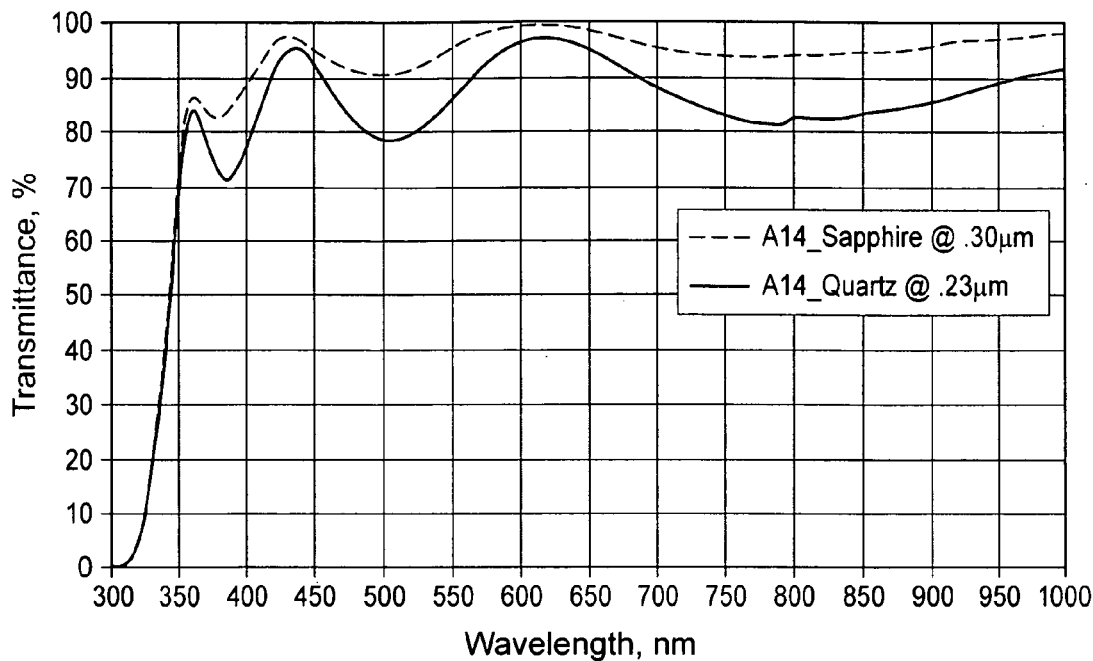
FIG. 3 plots the percent transmittance versus wavelength for 0.30 um and 0.23 um thick high index matching layers prepared from inorganic-organic polymer matrix systems in accordance with certain example embodiments.

FIG. 3 plots the percent transmittance versus wavelength for 0.30 um and 0.23 um thick high index matching layers prepared from inorganic-organic polymer matrix systems in accordance with certain example embodiments. The 0.30 um and 0.23 um thick high index matching layers were deposited on sapphire and quartz substrates, respectively. As can be seen from FIG. 3, transmission was at least about 80% throughout the visible spectrum. Certain example embodiments may have yet higher transmissions, e.g., at least about 85%, more preferably at least about 90%, and sometimes even higher.

Figure 4:
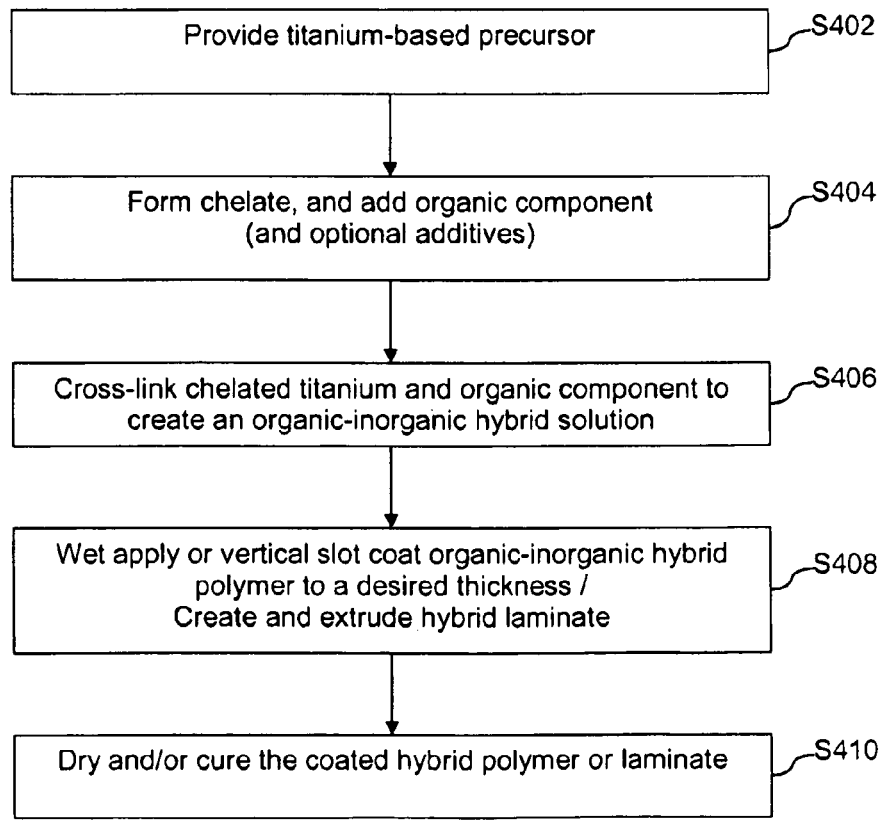
FIG. 4 is a flowchart illustrating an example process for making a hybrid high refractive index film in accordance with certain example embodiments.

FIG. 4 is a flowchart illustrating an example process for making a hybrid high refractive index film in accordance with certain example embodiments. In step S402, an inorganic-based precursor is provided. In certain example embodiments, the inorganic-based precursor may be a titanium-based precursor such as, for example, titanium alkoxide, a titanium-based phosphate complex, etc. The inorganic-based precursor may be deposited directly or indirectly on the LEDs in certain example embodiments and/or on a glass substrate. For instance, in certain example embodiments, a titanium alkoxide based precursor may be deposited via atomic layer deposition (ALD), a titanium-based phosphate layer may be printed, etc. Of course, it will be appreciated that other high-index inorganic materials may be used in place of or in addition to the titanium in certain example embodiments.

In step S404, a chelate may be formed, and an organic component may be added, together with optional additives. The chelate in certain example instances may be salicylic acid. The organic component in certain example embodiments may be a resin, silicone, polyimide, polyamide, and/or the like.

Optional additives also may be introduced. For instance, other inorganic materials (e.g., in place of or in addition to the titanium-based precursor) may be introduced to tune the index of refraction. Indeed, the index of refraction may be adjusted upwardly or downwardly by selective inclusion of zirconia, silica and/or silicates, etc. Light scattering elements and/or heat dissipating elements also may be introduced. One example material that functions both as a lighter scattering agent and a heat dissipater is boron nitride. Plasticizers also may be included in certain example embodiments.

In step S406, the chelated titanium-based precursor and the organic component(s) may be cross-linked to create an organic-inorganic hybrid solution. In one example, titanium alkoxide may be reacted with a chelating agent to convert the tetra-coordinate Ti species into a less reactive hexa-coordinate species, e.g., to create chelated poly(dibutyl titanate). Of course, other titanates may be created and/or used in different embodiments of this invention. The hybrid polymer may result in certain example instances by mixing together the chelated poly(dibutyl titanate) with a hydroxy inclusive organic resin. In certain example embodiments, the organic and inorganic components may be provided in equal percentages by weight. In certain example embodiments, the organic and inorganic components may be provided in a ratio of 60/40 by weight. Of course, other ratios and/or percentages are possible in different embodiments of this invention.

The hybrid solution may be quite liquidous in certain example embodiments. A liquidous hybrid solution may be advantageous in some example instances because of its ability to "float" or "swim" between LEDs. In such a case, the hybrid solution may be wet applied, vertical slot coated, or otherwise provided to a desired thickness. In certain example embodiments, however, it may be desirable to provide a more viscous hybrid laminate (e.g., inorganic and/or other materials included in an organic binder such as EVA, silicones, aramids, etc.) that can be extruded, for example. A more viscous hybrid laminate may be advantageous in terms of a "cleaner" or "less messy" application. The application of the hybrid polymer or laminate is shown in step S408.

In step S410, the coated hybrid polymer or laminate is dried and/or cured. The drying and/or curing may help to remove solvents and water, leaving more inorganic material than organic material in certain example embodiments. The drying may take place at a first elevated temperature of less than about 250 degrees C., whereas the curing may take place at a second elevated temperature of greater than or equal to about 300 degrees C. Certain example embodiments may include one or both of drying and curing at these and/or any other suitable temperature.

Figure 5:
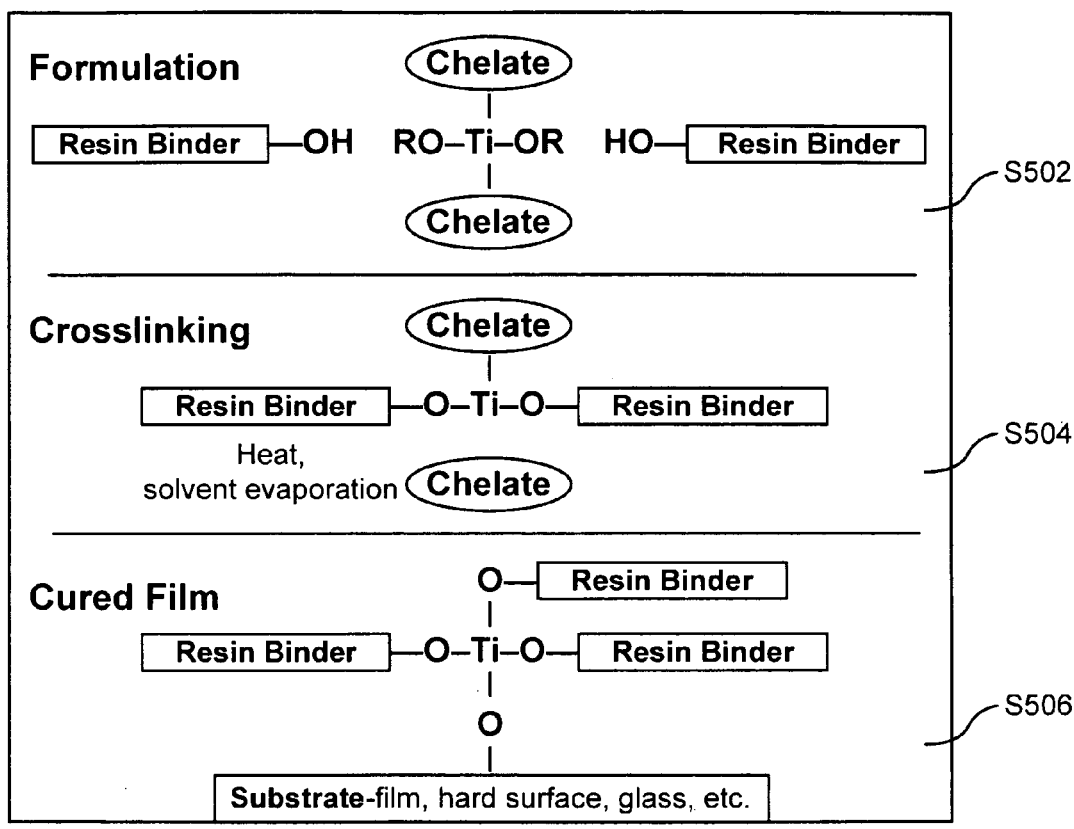
FIG. 5 shows the basic formulation, cross-linking, and curing steps involved in the FIG. 4 example process.

FIG. 5 shows the basic formulation, cross-linking, and curing steps involved in the FIG. 4 example process. As can be seen in FIG. 5, a chelated Ti-based precursor is brought into contact with a resin binder in step S502. In step S504, the resin binder and the chelated Ti-based precursor are cross-linked. The solvent is evaporated through a heating process, and the cured film is adhered to a substrate (e.g., a film, hard surface, glass, etc.) in step S506.

Certain example embodiments relate to enhanced scattering of the light from an LED (e.g., ILED) array, e.g., using a scattering layer. A scattering layer may in certain example instances enhance light outcoupling from the ILED array, and/or help achieve non-Lambertian broad-band scattering useful in achieving a high CRI. Experiments have shown that a surface texture on a scale of half an internal optical wavelength may produce a high degree of (and sometimes even complete or substantially complete) internal angular randomization of light rays in a semiconductor film. This may be accomplished by natural lithography or any other suitable technique.

The creation of a light scattering layer may include thin film fractal embossing directly or indirectly on the light-emitting region, for example. This process step in certain example embodiments may take place may after thin-film transfer and bonding. In certain example embodiments, a fractal pattern having a suitable porosity (e.g., 10-30% porosity in certain example instances) for light scattering may be located, directly or indirectly, on the light-emitting region of the LEDs. Randomness may be inserted into the fractal pattern by any suitable technique. For example, randomness may be introduced using a self-similar distribution, e.g., by modifying the Sierpinski gasket construction by starting with a filled-in unit square, removing a randomly selected quadrant of the square, removing a randomly selected quadrant of the remaining squares, etc. Another way to add randomness to fractal constructions involves statistical self-similarity, e.g., by scaling each piece of a pattern by a random amount selected from a set range at each iteration, rather than specifying exact scalings. Random fractals also may be generated by stochastic processes such as, for example, trajectories of the Brownian motion, Levy flight, fractal landscapes, the Brownian tree, etc.

Using the above-described and/or other techniques, a template with appropriate features may be generated. The template may then be transferred to the target area. The template may itself accomplish the scattering in certain example embodiments. However, in certain other example embodiments, the template may function as a mask and portions may be etched away (e.g., photolithographically, by chemicals, etc.) so as to create the desired light-scattering features, and the template optionally may be removed. In certain example embodiments, the feature may be applied to the light emitting diodes or at any suitable interface. In certain example embodiments, an interface, the chips, the polymer, semiconductor layers, etc., may be textured, to help achieve the desired light-scattering effects.

Light scattering also may be obtained using polystyrene spheres having a 0.2 um radius that are used to coat the surface of the LED in a randomly close-packed array. A similar porosity to that described above may be used in such example instances. The polystyrene spheres may be attached by surface forces in a dipping process, by spin coating, and/or the like, from an aqueous solution. Such processes may result in the random location of the spheres. The spheres also may act as an etch mask for a Cl-assisted Xe+ ion beam etching, of about 10-300 nm, preferably 10-170 nm deep into the n+ and/or other AlGaAs layer(s). Plasmas also may be used to perform such etching. These etching techniques also may be used for the fractal patterning embodiments described above. Although certain example embodiments have been described in relation to polystyrene spheres, it will be appreciated that other materials and/or other shapes may be used in different embodiments of this invention.

Figure 6:
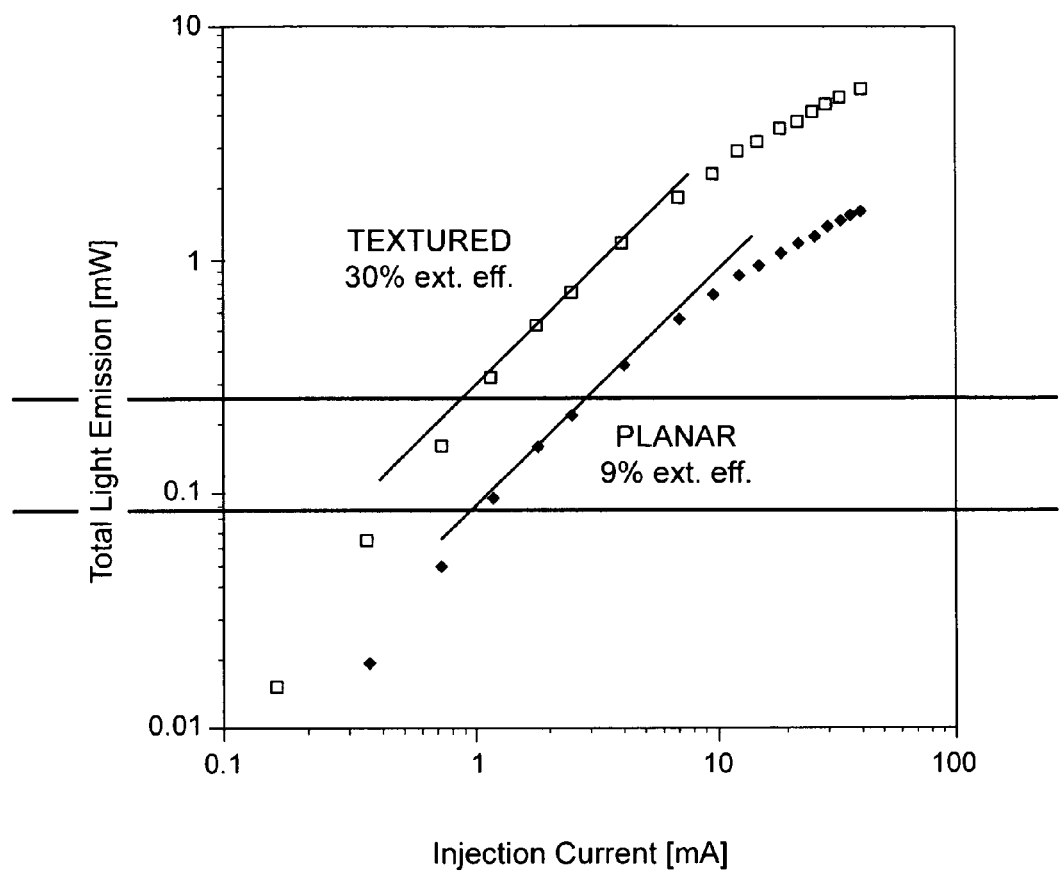
FIG. 6 plots the luminous efficacy of an AlGaAs diode with and without the enhanced light scattering caused by the thin film fractal embossing of certain example embodiments.

Total LED light emission vs. the injection current for enhanced and non-enhanced AlGaAs diodes is plotted in FIG. 6. Thus, FIG. 6 may be thought of as plotting the luminous efficacy of an AlGaAs diode with and without the enhanced light scattering caused by the thin film fractal embossing of certain example embodiments. Calibration may be obtained by the ratio of photodiode current to LED current, with a small correction for photodiode quantum efficiency. The angular distribution of light from these LEDs is Lambertian.

The linear fits on FIG. 4 indicate the broad optimal current range, which may sometimes be limited by heating at the high end and non-radiative recombination at the low end. The squares and diamonds represent two devices drawn from the same wafer and processed together up to the final texturing step.

Figure 7A:
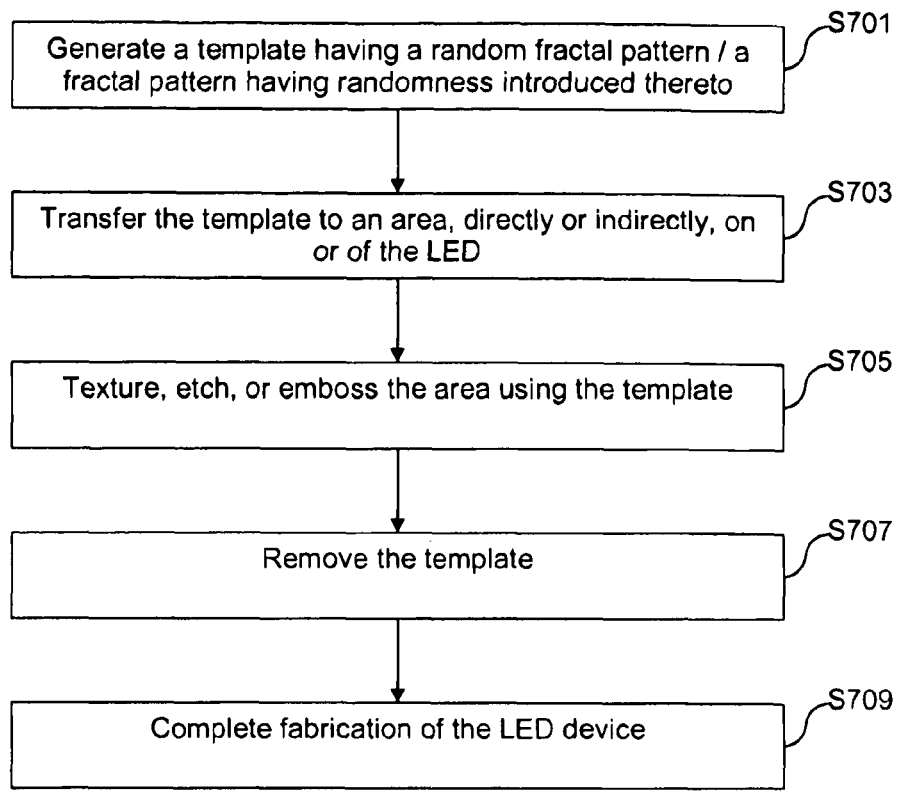
FIG. 7a is a flowchart illustrating an example process for helping to achieve non-Lambertian broad-band scattering useful in achieving a high CRI using fractal patterns in accordance with certain example embodiments.

FIG. 7a is a flowchart illustrating an example process for helping to achieve non-Lambertian broad-band scattering useful in achieving a high CRI using fractal patterns in accordance with certain example embodiments. In step S701, a template having a having a random fractal pattern or a fractal pattern having randomness introduced thereto is generated. The template is transferred to an area, directly or indirectly, on or of the LED, in step S703. For example, in certain example embodiments, the area may be on an outermost layer of the LED, a semiconductor layer of the LED, an interface in an LED device subassembly, etc. The area is then textured, etched, or embossed in step S705, using the template. In texturing and/or etching embodiments, the template may be used as a mask (e.g., if formed from a photosensitive base) for photolithographic patterning, plasma etching, wet etching, and/or the like. In certain example embodiments, the template may be removed in step S707. However, the template may be left in place in different embodiments of the invention. The fabrication of the LED device may be completed in step S709.

Figure 7B:
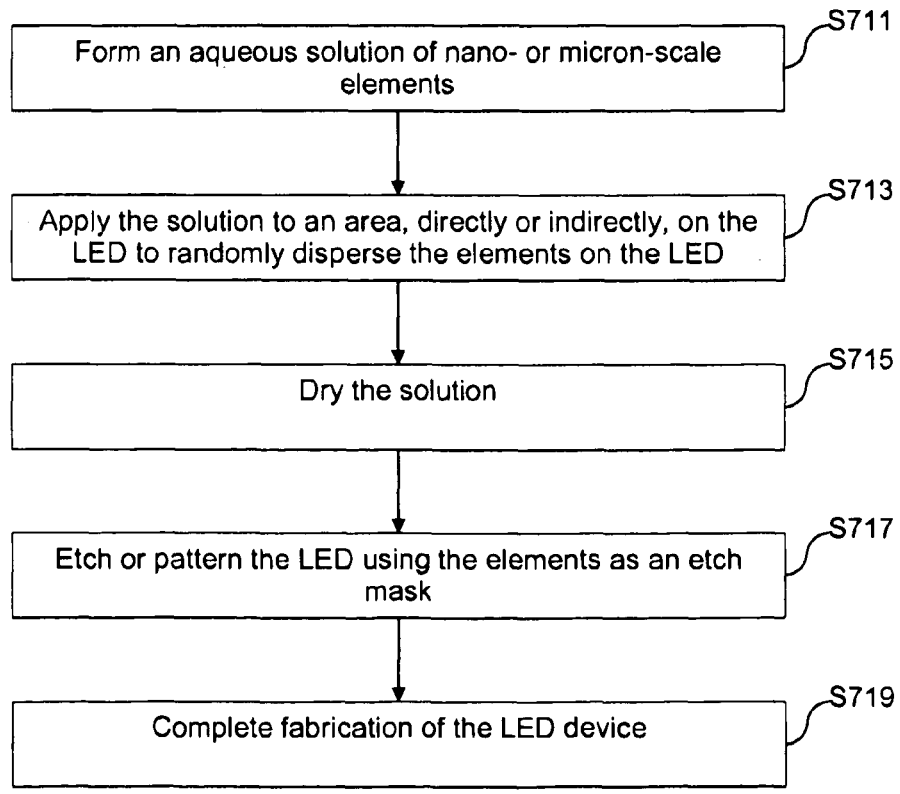
FIG. 7b is a flowchart illustrating an example process for helping to achieve non-Lambertian broad-band scattering useful in achieving a high CRI using scattering elements in accordance with certain example embodiments.

FIG. 7b is a flowchart illustrating an example process for helping to achieve non-Lambertian broad-band scattering useful in achieving a high CRI using scattering elements in accordance with certain example embodiments. In step S711, an aqueous solution of nano- or micron-scale elements is formed. For example, spheres, eye-shaped, cubic, and/or other shaped objects may be used. Such objects may have a major diameter or distance ranging from approximately 0.01-1 um in certain example embodiments. The size and number of elements may be selected so as to provide a target porosity (e.g., along the lines of the above) once the aqueous solution is applied to an area, directly or indirectly, on the LED. The solution may be wet applied, e.g., via spin, roll, dip, slot die, and/or other coating techniques, in step S713. Such coating techniques may help to randomly disperse the elements on the LED, e.g., at the target porosity. In step S715, the applied solution is optionally dried. In certain example embodiments, the elements may be used as an etch mask such that the LED may be etched or patterned in step S717, e.g., photolithographically, using a plasma, etc. In certain example embodiments, the elements may be removed. The fabrication of the LED device may be completed in step S719.

Certain example embodiments also relate to "active cooling" techniques for ILED arrays. Such active cooling techniques may help improve efficiency and extend the product lifetime. Chip makers currently attempt to reduce the strong parasitic absorption at the electrodes, which is a known issue in all LEDs, by employing an LED design that uses lateral injection and depends on current crowding. The diode current is crowded into a central region between the two ohmic contacts, but reasonably distant from either contact. This design approach reduces parasitic optical absorption at the ohmic contact but also unfortunately exacerbates localized heating.

The use of LEDs (e.g., InGaN, AlGaAs, and/or the like) in solid-state lighting and other high-lumen applications would benefit from the development of LEDs with optical output much greater than that achieved with traditional LEDs. A conventional InGaN LED has a 350 micron chip, with a semi-transparent current spreading p-contact, and is typically packaged in a 5 mm lamp. As explained above, light extraction efficiency is poor because of light absorption in the semi-transparent contact. In addition, the high thermal resistance of the 5 mm lamp (150 degrees C./W) limits the maximum drive current. Consequently, the optical power and lumen outputs are rather low.

In contrast to the conventional packaging of the InGaN LED in an epi-up configuration, certain example embodiments involve flip chip packaging of the LED in an epi-down configuration. This example configuration may help to reduce the thermal resistance of the LED. This example configuration also may in certain example instances enable the LED to be driven at higher currents. Calculations show that the use of active thermoelectric cooling without replacing the semi-transparent contact with a reflecting p-contact and use of the flip chip geometry advantageously results in an increase in the optical extraction efficiency of about 160-300%. These are superior results compared to conventional outputs. Furthermore, in example embodiments that implement active cooling techniques of the kind the same as or similar to those described herein, the size of the LED and/or the LED drive current may be further increased. This advantageously results in even greater increases in the optical power and lumen output.

Figure 8:
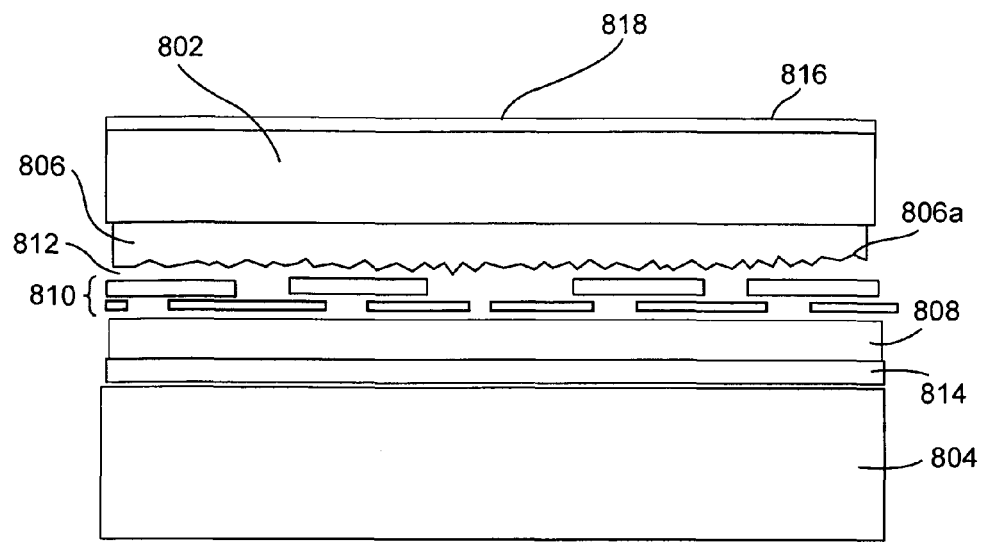
FIG. 8 is a cross-sectional view of a flat ILED matrix laminate in accordance with certain example embodiments.

FIG. 8 is a cross-sectional view of a flat ILED matrix laminate in accordance with certain example embodiments. The FIG. 8 assembly includes first and second glass substrates 802 and 804. The first substrate 802 may be thought of as being a superstrate in certain example embodiments. A high index laminate 806 is supported by the superstrate first substrate 802. In certain example embodiments, the laminate 806 may be formed from the organic-inorganic hybrid material described above, e.g., that has been extruded. The inner surface 806a of the laminate 806 may be textured in certain example instances. In certain example embodiments, the laminate 806 laminates together the first and second substrates 802 and 804.

A low index insulator 808 may be supported by second substrate 804. The low index insulator 808 in certain example embodiments may be a low index version of the organic-inorganic hybrid material described above, e.g., that has been extruded. Thus, in certain example embodiments, the laminate 806 and the low index insulator 808 may be formed from similar hybrid organic-inorganic materials, provided that their respective indices of refraction are tuned for their respective purposes. In certain example embodiments, the laminate 806 may have a high index of refraction, e.g., at least about 1.7, more preferably at least about 1.8, and sometimes even as high or higher than 1.9, and the insulator 808 may have a low index of refraction, e.g., lower than about 1.8, more preferably lower than about 1.7, and still more preferably as low as or lower than 1.6-1.65.

A high index layer 812 may be disposed between the laminate 806 and the flexible PCB that supports the LEDs 810. Flexible PCBs suitable for certain example embodiments may be manufactured or provided by Minco. The high index layer 812 may be an organic layer, e.g., of titanium oxide (e.g., $TiO_2$ or other suitable stoichiometry), zirconium oxide (e.g., $TiO_2$ or other suitable stoichiometry), etc. In certain example embodiments, the high index layer 812 may be formed from the hybrid organic-inorganic material described above. However, most or all of the organic elements may be removed therefrom while in the liquid state or once at least initially applied (e.g., by drying and/or curing at one or more elevated temperatures) in certain example instances, e.g., to increase the index of refraction yet further. In certain example embodiments, the material may be wet applied or slot die coated so that the liquidous material fills the gaps between adjacent LED components and forms a good contact against the flexible PCB 810 with the LEDs disposed thereon. The surface of the inorganic layer 812 may be textured in certain example embodiments. In certain example embodiments, one or more of the laminate 806, insulator layer 808, and high index layer 812 may be formed from the organic-inorganic hybrid material (or plural respective versions thereof), with each layer having its index tuned by virtue of the additives in the hybrid solution.

A mirror 814 may be disposed between the insulator 808 and the second substrate 804 in certain example embodiments. The mirror 814 in certain example instances may comprise a plurality of thin film layers such as, for example, Sn, Ag (e.g., about 1000 angstroms thick), and Cu (about 350 angstroms thick), in that order moving away from the second substrate 804. Of course, other materials may be used in place of or in addition to the example materials listed herein. Other types of mirrors also may be used in different example embodiments of this invention. The mirror 814 advantageously may act as a heat sync, thereby helping to improve the performance of the LEDs in the assembly.

One or more optional layers may be provided on the superstrate glass 802. In certain example embodiments, a CRI matching layer 816 may be provided on the superstrate glass 802. The CRI matching layer may comprise Cd-based materials such as, for example, CdTe nano-crystals; a matrix of quantum dots; etc. In certain example embodiments, a diffuser and/or antireflective (AR) composite layer may be provided on the superstrate glass 802. The AR layer may be a three-layer AR coating in certain example embodiments. See, for example, U.S. application Ser. No. 12/923,146, the entire contents of which are hereby incorporated herein by reference.

In certain example embodiments, phosphors may be embedded in or disposed in a layer on the superstrate glass 802. UV radiation from the LEDs may cause the phosphors to emit light.

In certain example embodiments, a first, thin (e.g., 1 mm thick) low-iron glass substrate may be provided. An anode layer including a transparent conductive coating (TCC) may be blanket coated thereon, e.g., via a wet application in certain example embodiments. It may be advantageous in certain example instances to use an ion beam to planarize the OCLS in certain example instances. The blanket anode layer may be laser patterned into the appropriate circuitry. An out-coupling layer stack (OCLS) used for index matching to the TCC may be interposed between the first glass substrate and the anode layer. The patterned anode layer may be encapsulated in certain example embodiments, e.g., using a heat conductive resin layer of the type described herein. As indicated above, this may help address the internal junction temperature of the LEDs, thereby improving efficiency and providing an all solid-state (or substantially all-solid state) intermediate article or finished product. A second glass substrate may support a mirror coating (e.g., an Al or Cu mirror coating) in certain example embodiments. The substrate may be etched to form holes, and a dessicant may be inserted into such holes. OLEDs and/or ILEDs may be used in such an example arrangement. In certain example embodiments, the location of the anode and the cathode may be interchanged.

Figure 9:
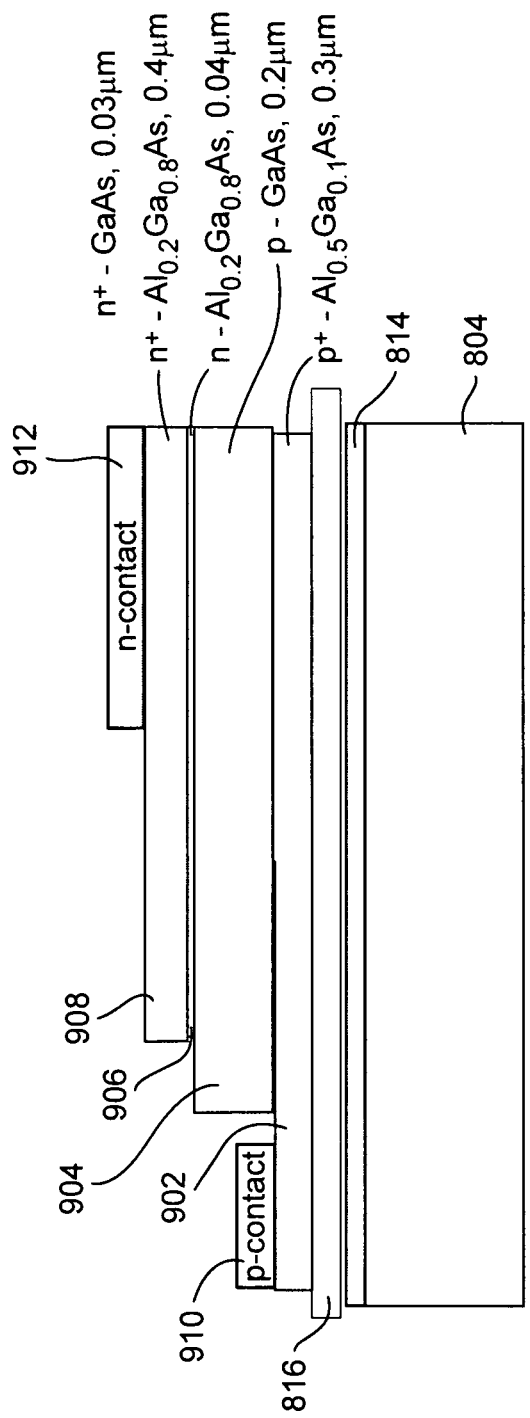
FIG. 9 is an illustrative ILED structure based on AlGaAs in accordance with certain example embodiments.

FIG. 9 is an illustrative ILED structure based on AlGaAs in accordance with certain example embodiments. The ILED structure shown in FIG. 9 includes a plurality of layers. The layers may include, in order moving away from the second substrate 804, a p+ layer 902 of or including AlGaAs (e.g., that is about 0.3 um thick), a p 904 layer of or including GaAs (e.g., that is about 0.2 um thick), an n layer 906 of or including AlGaAs (e.g., that is about 0.04 um thick), an n+ layer 908 of or including AlGaAs (e.g., that is about 0.4 um thick), and/or an n+ layer of GaAs (e.g., that is about 0.03 um thick). A p-contact 910 may be provided on an in contact with the p layer 902 in certain example embodiments, and an n-contact 912 may be provided as an uppermost layer on and in contact with one or more n+ layers. As indicated above, one or more of the n– and/or other layers may be roughened or etched in certain example embodiments. Also as indicated above, structuring, etching, patterning, and/or the like may be performed at the wafer level in certain example embodiments. Although FIG. 9 shows an AlGaAs-type ILED, it will be appreciated that AlGaN heterostructures may be used in different embodiments of this invention.

As alluded to above, the inventors of the instant application have realized that the efficiency of LED lighting systems may be increased by providing advanced cooling techniques and that one to accomplish this is through the use of thermoelectric cells. Thermoelectric cells rely on the thermoelectric effect, which generally refers to the conversion of temperature differences to electric voltage and vice versa. In such systems, at the atomic scale, an applied temperature gradient causes charged carriers (e.g., electrons or electron holes) in the material to diffuse from the hot side to the cold side. Thus, a thermoelectric device creates a voltage when there is a different temperature on each side. This effect thus can be used to generate electricity. Certain example embodiments provide techniques for improving the performance of LED-based arrays using thermoelectric (TE) modules in conjunction with super-insulating, yet optically transmissive, vacuum insulated glass (VIG) unit technologies.

In certain example embodiments, a vacuum insulated glazing (VIG) unit is used as a medium of high thermal resistance (R>12) to house thermoelectric junctions arrays, which are electrically in series and thermally in parallel, on the side facing the sun. According to certain example embodiments, the R-value preferably is at least 10, more preferably at least 12, and possibly even higher. High R-values such as these are currently achievable in VIG units manufactured by the assignee of the instant invention. Such units generally incorporate fired pillars and low-E coatings. Of course, a typical argon- and/or xenon-filled IG unit provides an R-value of about 4, and may be used in connection with certain example embodiments provided that the TE coefficient of merit Z is increased to a suitable level, e.g., as discussed in greater detail below. In any event, an R-value of 10 will provide a delta T of about 400 degrees C., and an R-value of about 12 will provide a delta T of about 600 degrees C.

The number of junctions per unit area preferably is provided at a level such that the fill factor is less than 20%. As is known, fill factor refers to the ratio (given as percent) of the actual maximum obtainable power to the theoretical power. Of course, it will be appreciated that the fill factor may be balanced with the Z-value, similar to as noted above. Thus, where the Z-value is greater than or equal to about 10, the fill factor may be reduced to less than or equal to about 10%.

According to certain example embodiments, the VIG unit may serve multiple purposes. For example, the VIG unit may provide a support for the TE junctions, which may be integrated within the VIG. As another example, the VIG unit may provide for very large temperature differentials between the hot and cold junctions via the inclusion of the TE devices within the VIG unit itself. The large delta T, in turn, may help increase the TE efficiency substantially. As still another example, the VIG unit may provide support for flip-chip or otherwise mounted LEDs. As still another example, the VIG unit may help thermally insulate the LED devices and reduce the likelihood of the LED from reaching temperatures that will degrade its operational efficiency.

Figure 10:
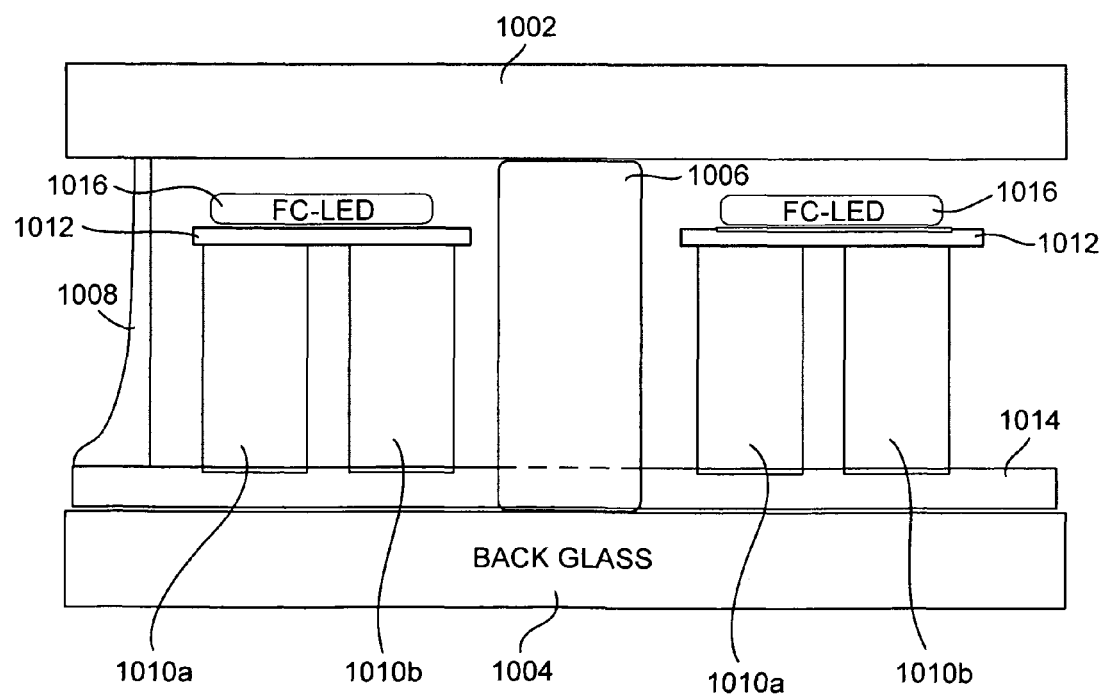
FIG. 10 is a cross-sectional view demonstrating illustrative active cooling techniques for a flip-chip mounted LED array using thermoelectric modules in accordance with certain example embodiments.

FIG. 10 is a cross-sectional view demonstrating illustrative active cooling techniques for a flip-chip mounted LED array using thermoelectric modules in accordance with certain example embodiments. Similar to conventional VIG units, the FIG. 10 example embodiment includes an outer substrate 1002 and an inner substrate 1004. One or both of the outer and inner substrates 1002 and 1004 may be glass substrates in certain example embodiments of this invention. The substrates are provided substantially parallel, spaced apart relation to one another, and a plurality of pillars 1006 help maintain the distance between the outer and inner substrates 1002 and 1004. The pillars 1006 may be sapphire pillars in certain example embodiments of this invention. An edge seal 1008 is provided around the periphery to hermetically seal the VIG unit, e.g., so that a the cavity between the outer and inner substrates 1002 and 1004 may be evacuated to a pressure less than atmospheric and/or filled with a gas or gasses (such as, for example, argon, xenon, and/or the like). The outer and inner substrates 1002 and 1004 may be the same or different sizes in different embodiments of this invention.

Each thermoelectric module includes an n-leg 1010a and a p-leg 1010b and may be made of any suitable material. For example, the thermoelectric module may be bismuth-based (e.g., $Bi_2Te_3$, $Bi_2Se_3$, etc.), skutterudite materials (e.g., in the form of $(Co,Ni,Fe)(P,Sb,As)_3$ or the like), oxides (e.g., $(SrTiO_3)_n(SrO)_m$ or the like), etc. The thermoelectric material may be doped in certain example embodiments. When the TE material is doped, for example, the doping may be graded such that the doping is higher proximate to the hot junction.

The n-leg 1010a and a p-leg 1010b of the modules may be connected by a conductor 1012, sometimes referred to as a blackened conductor because of the material used therein, even though light may still be transmitted therethrough. The conductor 1012 may in certain example embodiments be a copper-based material (Cu, CuO, etc.), a frit (e.g., of carbon black such as DAG or the like), a CNT-based ink, etc. The thermoelectric modules may be screen printed in certain example embodiments of this invention. The size of each module may be selected in conjunction with the desired fill factor. When a 20% fill factor is used, for example, a substantially square approximately 1"×1" module size may be used, although other sizes and/or shapes are possible in connection with this and/or other fill factors. In certain example embodiments, the pillars 1006 may be placed following the screen printing of the TE materials.

In certain example embodiments, the TE modules are not in direct contact with the inner substrate 1004. Instead, in certain example embodiments, a bus bar 1014 is provided between the inner surface of the inner substrate 1004 (surface 3) and the thermoelectric materials. This bus bar may be transparent and thus may be of or include any suitable material such as, for example, a transparent conductive coating of or including Ag, ITO, AZO, indium-gallium-oxide, etc. The conductive coating may also be a CNT-based, graphene based, etc. CNT-based conductive coatings/devices and methods of making the same are disclosed in, for example, U.S. application Ser. No. 12/659,352, the disclosure of which is hereby incorporated herein by reference, and graphene-based conductive coatings/devices and methods of making the same are disclosed in, for example, U.S. application Ser. No. 12/654,269, the disclosure of which is hereby incorporated herein by reference. To help facilitate the transfer of power, a silver or other conductive frit (not shown) may be provided proximate to the edge of the VIG unit and in direct or indirect contact with the bus bar 1014. In certain example embodiments, the edge seal 1008 itself may be formed from a conductive material and thus may serve as the appropriate connection.

Flip-chip mounted LEDs 1016 may be disposed on the conductors 1012. More specific details of the flip-chip mounted LEDs 1016 are provided below, e.g., in connection with FIG. 12.

Figure 11:
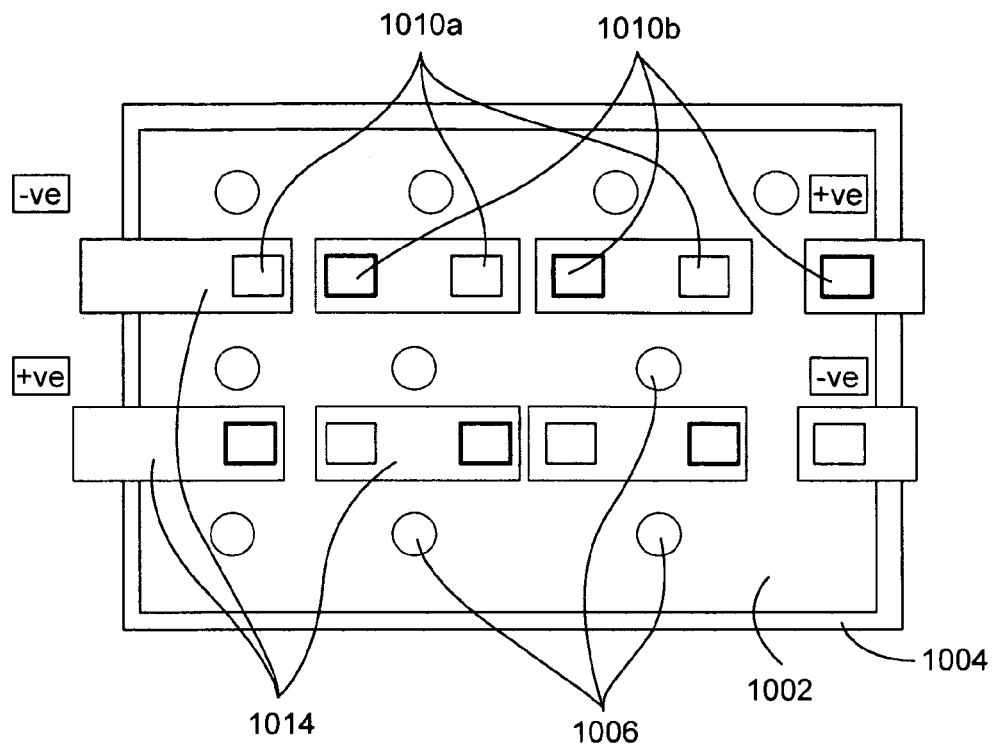
FIG. 11 is a plan view of an ILED structure electrically connected in series and thermally connected in parallel in accordance with certain example embodiments.

FIG. 11 is a plan view of an ILED structure electrically connected in series and thermally connected in parallel in accordance with certain example embodiments. The TE modules are electrically connected in serial such that the n-leg in a first module is connected to the p-leg in a second module (or vice versa), etc., until the end of a row or column, and then adjacent columns or rows are connected, and the pattern repeats along the new row. The TE modules are thermally connected in parallel because they are all located within the cavity of the VIG unit. Each side of the VIG unit contains at least one positive terminal and at least one negative terminal. The silver fit discussed above thus may provide around substantially the entire periphery of the VIG unit, at locations where the terminals are to be provided, etc. As can be seen from FIG. 11, the TE modules occupy space such that a predetermined fill factor is met (in this example case, about 20%).

Further details regarding TE modules can be found, for example, in U.S. application Ser. No. 12/801,257, the entire contents of which is hereby incorporated herein by reference.

Figure 12:
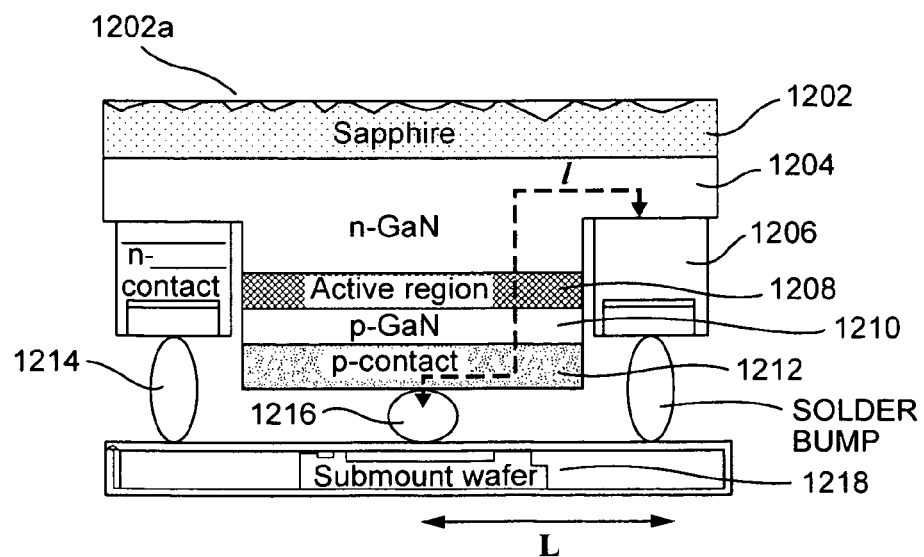
FIG. 12 is a cross-sectional view of a flip-chip sub-mount wafer in accordance with certain example embodiments.

FIG. 12 is a cross-sectional view of a flip-chip sub-mount wafer in accordance with certain example embodiments. In general, flip-chip mounting is one type of mounting used for semiconductor devices, such as integrated circuit (IC) chips, which reduces the need for wire bonds. The final wafer processing step deposits solder bumps on chip pads, which connect directly to the associated external circuitry. The processing of a flip-chip is similar to conventional IC fabrication. Near the end of the process of manufacturing a flip-chip, attachment pads are metalized to make them more suitable for soldering. This metalizing typically includes several treatments. A small solder dot is deposited on each of the pads. The chips are cut out of the wafer, as conventional. Additional processing generally is not required, and generally there is no mechanical carrier at all. When a flip-chip is attached to a circuit, it is inverted to bring the solder dots down onto connectors on the underlying electronics or circuit board. The solder is then re-melted to produce an electrical connection. This leaves a small space between the chip's circuitry and the underlying mounting. In most cases an electrically-insulating adhesive is then used to provide a stronger mechanical connection, provide a heat bridge, and to ensure the solder joints are not stressed due to differential heating of the chip and the rest of the system. The resulting completed assembly is much smaller than a traditional carrier-based system. The chip sits on the circuit board, and is much smaller than the carrier both in area and height.

Referring once again to FIG. 12, a substrate 1202 is provided, e.g., as cut from a wafer. The substrate 1202 in certain example embodiments may be sapphire, quartz, or any other suitable material. An outer surface 1202a may be textured, patterned, embossed, or the like, in certain example instances, e.g., as described above. The substrate 1202 may support a plurality of thin film layers including, for example, an n-type GaN layer 1204. The n-type GaN layer 1204 may, in turn, support n-contacts 1206, e.g., at the periphery thereof. In the center of the n-type GaN layer 1204 in certain example arrangements, a plurality of further thin-film and/or other layers may be provided. For example, an active region 1208, a p-type GaN layer 1210, and a p-contact 1212 may be provided. The n-contacts 1206 and the p-contact 1212 may be connected to a submount wafer 1218 by solder balls 1214 and 1216, respectively, in certain example embodiments. In certain example embodiments, the GaN and/or other layers may be InGaN layers.

Figure 13:
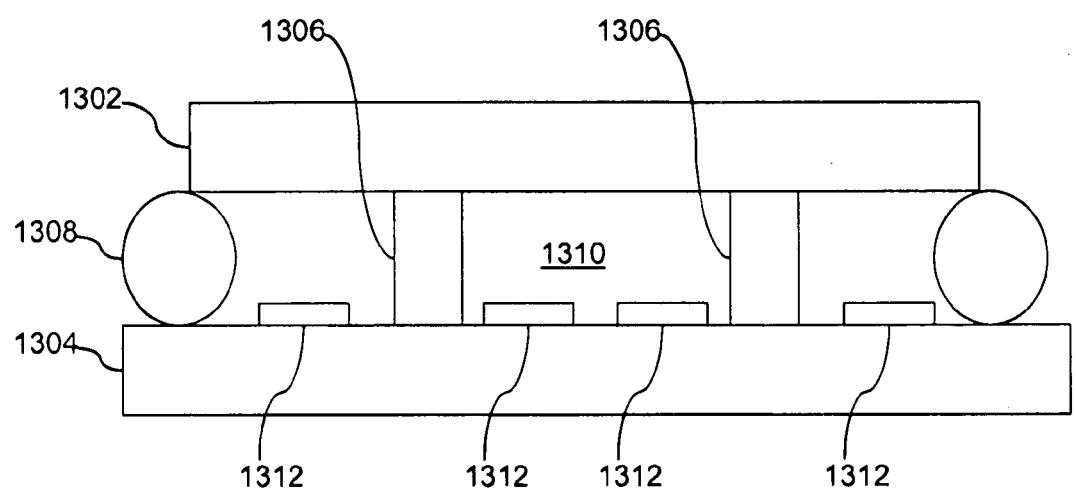
FIG. 13 is an example VIG incorporating LEDs in accordance with an example embodiment.

FIG. 13 is an example VIG incorporating LEDs in accordance with an example embodiment. FIG. 13 is similar to FIG. 10, in that FIG. 13 includes first and second substantially parallel spaced apart glass substrates 1302 and 1304. A plurality of pillars 1306 helps maintain the first and second substrates 1302 and 1304 in proper orientation, and an edge seal 1308 hermetically seals the cavity 1310. In any event, a plurality of LEDs 1312 is supported by the second substrate 1304 in certain example embodiments.

The cavity 1310 may be evacuated to a pressure less than atmospheric in certain example embodiments. In certain example embodiments, the cavity 1310 may be "back filled" with a suitable gas (e.g., an inert gas such as, for example, Ar, Kr, Xe, Ne, He, etc.). He has been found to be particularly advantageous in connection with certain example embodiments because it is a good heat transfer material. A VIG that includes He, for example, therefore may be provided in place of thermocouples in certain example instances.

The above-described techniques may be used in connection with the FIG. 13 example embodiment. For instance, a high index layer may be provided over the LEDs. It may in certain example instances be advantageous to remove all or substantially all of the organic material from the above-described hybrid layer (e.g., upon curing) in connection with the FIG. 13 example embodiment. Embossing, patterning, and/or other techniques also may be used. Although not shown, the LEDs 1312 may be provided on a flexible PCB (not shown), e.g., the LEDs 1312 may be flip-chip mounted thereto in certain example instances. In certain example embodiments, the LEDs 1312 may be embedded in a laminate (not shown).

Vacuum insulating glass (VIG) units are known in the art. For example, see U.S. Pat. Nos. 5,664,395; 5,657,607; and 5,902,652, U.S. Publication Nos. 2009/0151854; 2009/0151855; 2009/0151853; 2009/0155499; 2009/0155500, and U.S. application Ser. Nos. 12/453,220 and 12/453,221, the disclosures of which are all hereby incorporated herein by reference. The edge seal, pump-out, and/or other techniques/configurations of these references may be used in connection with certain embodiments of this invention.

The techniques described herein advantageously may help to provide improved colormetrics. As will be appreciated, when LEDs are pre-packaged and/or purchased in bulk, the colormetrics may differ. Certain example techniques described herein may help to reduce (and sometimes even eliminate) such issues.

Certain example embodiments have been described in relation to lighting products. However, the techniques described herein may be used in connection with other applications such as, for example, display products (e.g., for backlights in LCD and/or other flat panel designs), mobile devices, decorative elements (e.g., windows, doors, skylights, sidelights, etc.), etc.

In certain example embodiments, the Lambertian or non-Lambertian light sources may be disposed on flat, substantially flat, or curved substrates. Thus, it will be appreciated that the lighting devices may include such flat, substantially flat, or curved substrates.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making an LED device, the method comprising:
    providing a substrate;
    forming a plurality of LEDs on the substrate; and
    creating a random pattern on the LEDs and/or in one or more layers of the LEDs, the random pattern having a light scattering effect on light produced by the LEDs, wherein the random pattern is a random fractal pattern or a fractal pattern having randomness introduced thereto.

2. The method of claim 1, wherein the creating of the random pattern comprises:
    generating the fractal pattern; and
    transferring the generated fractal pattern onto one or more layers of the LEDs.

3. The method of claim 2, wherein said transferring comprises embossing.

4. The method of claim 2, wherein the fractal pattern is generated in a template, the template being transferred onto one or more layers of the LEDs during the transferring.

5. The method of claim 4, further comprising etching the fractal pattern in one or more layers of the LEDs once the template is transferred thereto.

6. The method of claim 5, wherein the template is removed following the etching.

7. The method of claim 2, further comprising:
    generating a fractal pattern, the fractal pattern being a random fractal pattern or having randomness introduced thereto; and
    photolithographically patterning one or more layers of the LEDs using the generated fractal pattern.

8. The method of claim 1, wherein the fractal pattern is formed in an n-layer of one or more of the LEDs.

9. The method of claim 1, wherein the creating of the random pattern comprises:
    providing an aqueous solution of nano- or micron-scale elements; and
    disposing the solution to an area, directly or indirectly, on the LEDs to randomly disperse the elements on the LEDs.

10. The method of claim 9, further comprising drying the solution.

11. The method of claim 9, further comprising etching or patterning the LED using the dispersed elements as a mask.

12. The method of claim 9, wherein the elements are polystyrene spheres.

13. The method of claim 12, further comprising etching the LED using the dispersed polystyrene spheres as an etch mask for a Cl-assisted Xe+ ion beam etching.

14. The method of claim 9, wherein the size and amount of elements in the aqueous solution is selected so as to result in 10-30% porosity once disposed over the LEDs.

15. The method of claim 1, wherein the creating of the random pattern on the LEDs involves etching away 10-300 nm of an outermost surface.

16. The method of claim 1, wherein the creating of the random pattern on the LEDs involves etching away 10-300 nm of a semiconductor layer thereof.

* * * * *